(12) United States Patent
Buchanan et al.

(10) Patent No.: US 6,933,246 B2
(45) Date of Patent: Aug. 23, 2005

(54) DIELECTRIC FILM

(75) Inventors: Keith Edward Buchanan, Monmouthshire (GB); Joon-Chai Yeoh, South Wales (GB)

(73) Assignee: Trikon Technologies Limited, Newport (GB)

( * ) Notice: Subject to any disclaimer, the term of this patent is extended or adjusted under 35 U.S.C. 154(b) by 16 days.

(21) Appl. No.: 10/460,310

(22) Filed: Jun. 13, 2003

(65) Prior Publication Data

US 2003/0232510 A1 Dec. 18, 2003

Related U.S. Application Data

(60) Provisional application No. 60/392,057, filed on Jun. 28, 2002.

(30) Foreign Application Priority Data

Jun. 14, 2002 (GB) .............................................. 0213708
Jun. 18, 2002 (GB) .............................................. 0213888

(51) Int. Cl.$^7$ ........................ H01L 21/31; H01L 21/469
(52) U.S. Cl. ...................... 438/778; 438/781; 438/639; 257/642; 257/632
(58) Field of Search ................................ 438/778, 725, 438/637, 639, 781, 782, 793, 794, 627; 257/632, 638, 642, 759

(56) References Cited

U.S. PATENT DOCUMENTS

| 5,866,945 | A | 2/1999 | Chen et al. | |
|---|---|---|---|---|
| 5,958,798 | A | 9/1999 | Shields | |
| 5,985,747 | A | 11/1999 | Taguchi | |
| 6,114,250 | A | 9/2000 | Ellingboe et al. | |
| 6,114,259 | A | 9/2000 | Sukharev et al. | |
| 6,168,726 | B1 | 1/2001 | Li et al. | |
| 6,204,192 | B1 | * | 3/2001 | Zhao et al. .................. 438/723 |
| 6,351,039 | B1 | 2/2002 | Jin et al. | |
| 6,528,432 | B1 | * | 3/2003 | Ngo et al. .................. 438/780 |
| 6,562,416 | B2 | * | 5/2003 | Ngo et al. .................. 427/534 |
| 6,592,770 | B1 | 7/2003 | Dobson | |
| 2001/0038889 | A1 | 11/2001 | Pangrle et al. | |
| 2002/0093075 | A1 | * | 7/2002 | Gates et al. ................ 257/531 |
| 2002/0164877 | A1 | * | 11/2002 | Catabay et al. ............. 438/694 |

FOREIGN PATENT DOCUMENTS

EP 1 195 801 A2 4/2002
WO WO 02/01621 A2 1/2002

OTHER PUBLICATIONS

American Institute of Chemical Engineers, "Materials Engineering and Sciences Division Newsletter", Sep. 2000, vol. 31, Issue 1, pp. 1–10.
R.A. Donaton et al., "Physical and electrical characterization of silsesquioxane–based ultra–low k dielectric films", IEEE, 2000, pp. 93–95.
Related co–pending U.S. non–provisional Appl. No. 09/554,290, filed May 11, 2000, by Christopher David Dobson, and entitled "Method Of Treating An Insulating Layer".
Related co–pending U.S. non–provisional application (Serial No. not yet assigned), filed May 16, 2003, by Christopher David Dobson, entitled Method of Treating An Insulating Layer, and which is a Divisional of U.S. Appl. No. 09/554,290.

* cited by examiner

Primary Examiner—Caridad Everhart
(74) Attorney, Agent, or Firm—Volentine Francos & Whitt PLLC

(57) ABSTRACT

A low k porous dielectric film is described wherein the exposed surface or surfaces of the film are substantially non-porous. A densification method is described for treating such exposed surfaces to render porous surfaces non-porous.

19 Claims, 17 Drawing Sheets

Trikon Orion ™ film with ~0.28μm trench patterning and MOCVD TiN Barrier

TEM cross-section showing (AL) CVD TiN barrier interaction with porous low k IMD Ti Diffusion TiN MOCVD

SEM cross-section showing (MO) CVD TiN barrier interaction

Trikon Orion™ film with ~0.28μm trench patterning and MOCVD TiN Barrier thickness/composition map titanium map carbon map oxygen map

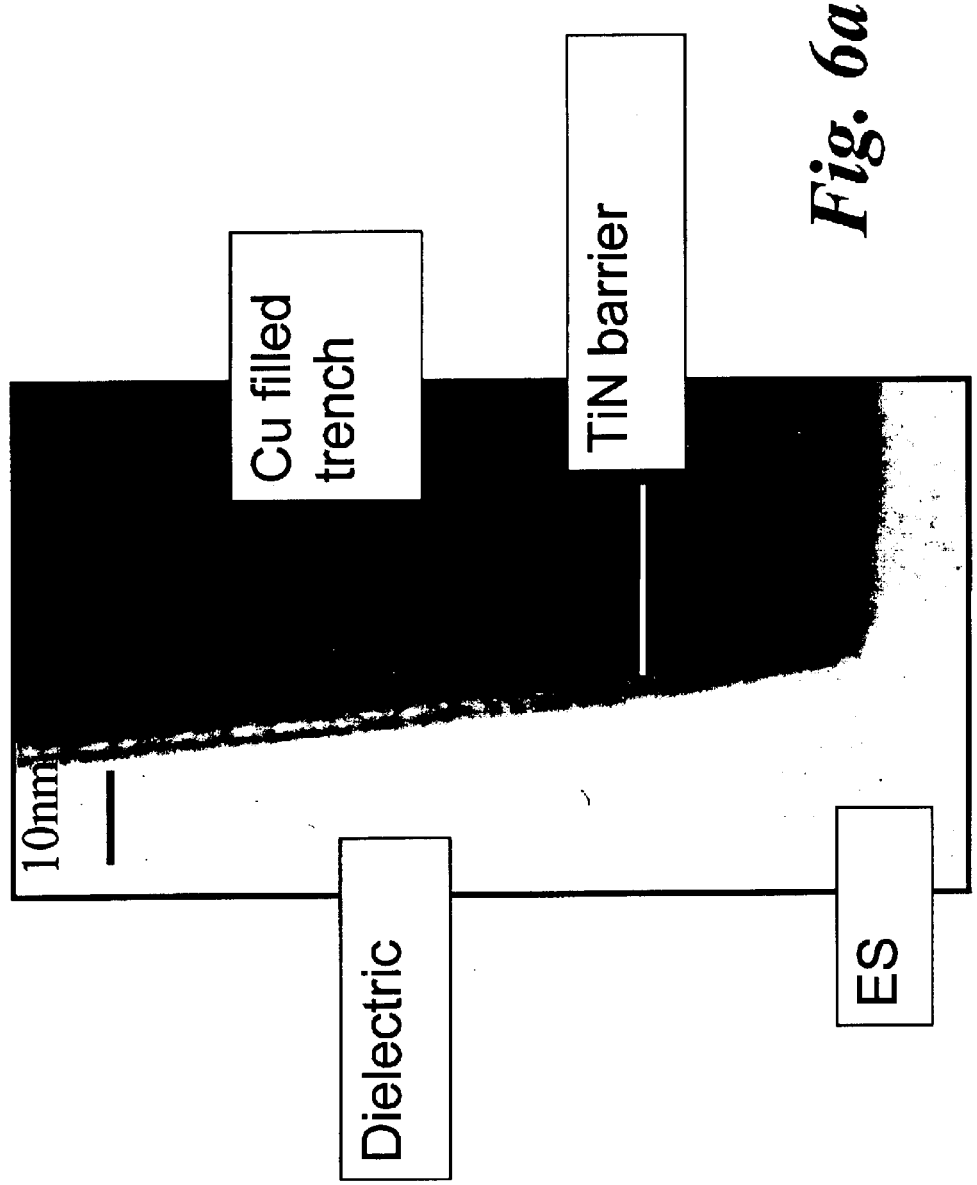

DIELECTRIC FILM

CROSS REFERENCE TO RELATED APPLICATIONS

A claim of priority is made to U.S. Provisional Patent Application Ser. No. 60/392,057, filed Jun. 28, 2002, and to British Patent Applications Nos. 0213708.1 filed Jun. 14, 2002 and 0213888.1 filed Jun. 18, 2002.

BACKGROUND OF THE INVENTION

1. Field of Invention

This invention relates to porous dielectric films having a dielectric constant (k) of less than about 2.5. Over the past years there has been a constant drive to produce dielectric materials having low dielectric constants for use, particularly, in semiconductor devices to accommodate the ever decreasing dimensions of the device architecture. It is presently believed that to achieve k values of less than about 2.5 for a practical insulator, there is inevitably a degree of porosity in these materials. This porosity can present major problems for integration, particularly when vias or interconnects are formed through the dielectric layer, because, when etched, the side walls of the etched formations are at least rough and possibly permeable, if the pores interconnect at all and intersect the surface.

It is into these etched trenches and vias that copper is deposited, in typical present day architectures, and because copper would readily diffuse into the dielectric material it must be contained by a diffusion barrier. An ideal would be an insulator that had barrier characteristics, but present day solutions rely upon separate deposited layers.

2. Description of the Related Art

Traditionally these barrier layers were deposited using physical vapour deposition techniques, but these techniques struggle to provide sufficient conformity of barrier coverage and so chemical vapour deposition (CVD) techniques are used e.g. Metal Organic CVD, Metal Halide CVD and Atomic Layer CVD. Whilst CVD techniques can give near 100% conformity, the precursors and reactants can penetrate the porous dielectric. This effect is shown in FIG. 1 (Source IMEC at the ARMM 2001 Conference) and FIG. 2 (Source Passemard et al; "integration issues of low k and ULK materials and damascene structure" at CREMSI 2001 Conference). In both cases, it will be seen that the side wall appears "fuzzy" and this indicates that CVD precursors have been absorbed into the porous dielectric layer giving rise to an indistinct barrier between the dielectric and the barrier layer.

EP-A-1195801 describes processes which are in fact believed to increase the porosity of the side walls and proposes sealing pores created from the side walls by providing a protective or sealing layer. It suggests that such a sealing layer can be formed by a plasma comprising oxygen and nitrogen, but gives no substantive description of the process. The addition of extra material into high aspect ratio vias is undesirable, both because it increases the aspect ratio of the via and may increase the resistance of the copper in the via. It is not clear whether or not the sealed surface maintains the local low k values as suggested in the application.

SUMMARY OF THE INVENTION

From one aspect the present invention includes a porous dielectric film having a dielectric constant (k) of less than about 2.5 and a carbon content of not less than 10% including a via or other formation etched therein characterised in the exposed surface or surfaces of the film within the via or formation is substantially non-porous.

It will be understood that this approach is in complete contrast to EP-A-1195801 where the processing of the dielectric increases the local porosity at the surface layer and this difficulty is only overcome by adding a further sealing layer.

It should also be noted that sealing porous surfaces at the top and bottom of structures is considerably easier than sealing side walls that are parallel to the flux of the incoming reactants.

In a preferred embodiment the exposed surface or surfaces is formed by a layer which is carbon depleted with respect to the bulk of the film. Additionally or alternatively the exposed surface or surfaces is formed by a layer which is of greater density than the bulk of the material film. In a particularly preferred embodiment the exposed surface or surfaces, may be formed by a layer which is carbon depleted with respect to the bulk of the film. Additionally or alternatively the exposed surface, or surfaces may be formed by a layer constituted substantially by Si—Si bonds and these bonds may be formed between trivalent Si molecules. Other mechanisms which are currently not understood but occur at the exposed surface or surfaces.

In each of these cases it will be understood that the layer defining the exposed surface or surfaces is formed by modifying the etched dielectric material and not by further deposition.

The bulk of the film is preferably formed of an SiCOH material.

The surface forming layer or layers may be formed by nitrogen and/or hydrogen containing plasma treatment of the etched surface or surfaces, which may be at least partially coincident with another process such as resist strip.

The invention further includes a barrier layer covering the exposed surface or surfaces, in which case the barrier layer does not penetrate the exposed surface or surfaces. The barrier layer is preferably deposited by chemical vapour deposition.

From a further aspect the invention consists in a method of forming an interconnect layer in a semiconductor device including:

a. depositing a low k porous dielectric film on a substrate;
b. depositing a resist;
c. patterning the resist to define etch apertures;
d. etching vias or formations in the dielectric layer through the apertures; and
e. stripping the resist characterised in that the resist is stripped with a nitrogen or a noble gas, or combination thereof, and hydrogen plasma or nitrogen or a noble gas, or a combination thereof, and oxygen plasma and the exposed surfaces of the vias or formations are simultaneously exposed to the plasma causing densification of the surface layers which define the exposed surfaces.

The method may also include the deposition of a barrier layer on the densified exposed surfaces. This barrier layer may be deposited by chemical vapour deposition.

Preferably the nitrogen or noble gas dominates the hydrogen or oxygen. Thus it is preferred that the ratio of $N_2:H_2$ is about 5:1.

The substrate may be RF bias during the stripping of the photo resist.

In alternative approaches the densification may take place during the etch step and it may be created by means of a non-oxidising plasma process, e.g. when the low k material is organic in nature.

Although the invention has been defined above, it is to be understood it includes any inventive combination of the features set out above or in the following description.

BRIEF DESCRIPTION OF THE DRAWINGS

The invention may be performed in various ways and a specific embodiment will now be described, by way of example, with reference to the following drawings, in which:

FIG. 6a is a bright field TEM of a cross section of a dielectric of the invention, barrier and copper filled trench.

DETAILED DESCRIPTION OF THE PREFERRED EMBODIMENTS

Figure 3:
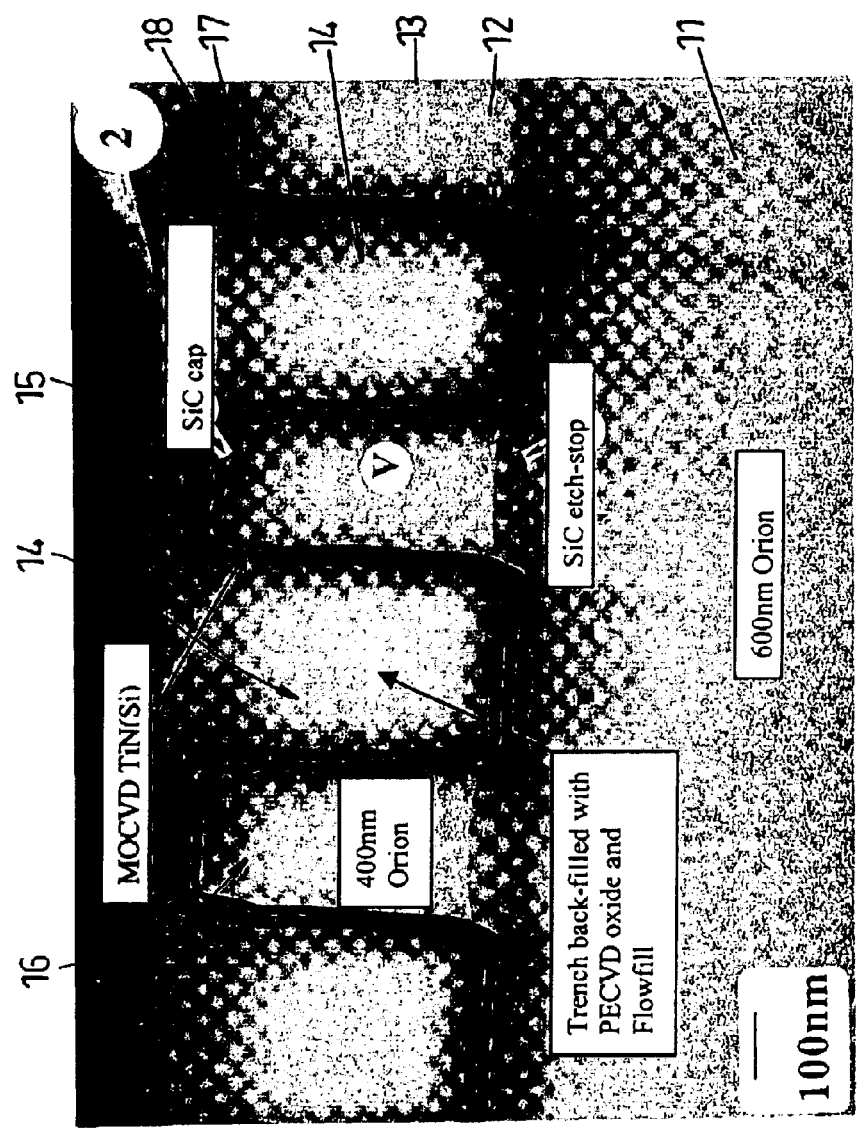
FIG. 3 is a transmission electron micrograph (TEM) of a cross section of a dielectric material formed with trenches to illustrate features of the invention.

Turning to FIG. 3 a test stack is illustrated to reveal a structure common in forming damascene interconnect architecture. The stack 10 is upon a base dielectric layer 11 and consists of an etch stop layer 12, a dielectric layer 13, which has trenches 14 etched therein, a silicon carbide cap 15 on the upper surface of the dielectric layer 13 and a barrier layer 16. A silicon oxide layer 17 and a planarisation layer 18 have been added purely for the purposes of TEM sample preparation.

The dielectric layers 11 and 13 are constituted by a low k SiCOH material having more than 10% carbon, which is trade marked Orion by the Applicants. This material is porous and has a dielectric constant k of about 2.2. The planarisation layer 18 is a material which is trade marked Flowfill by the Applicants.

The dielectric layers 11 and 13 were deposited using Trikon fxP™ tool for example as described in WO-A-01/01472, the disclosure of which is incorporated herein by reference. This material is a cold deposition of a polymer, which is then hydrogen plasma cured.

The trenches 14 were etched, without a hard mask, in a Trikon MORI™ helicon source plasma etch tool using $CF_4/CH_2F_2$ chemistry with RF wafer bias. Following the plasma etch the photo resist, which defines the etched apertures for the trenches, was stripped in situ in the MORI™ tool (i.e. in the same chamber) using 5:1 $N_2:H_2$ chemistry again with a helicon wave mode plasma source and applied RF wafer bias. This resist stripping also removes polymer residues. As is well known in the art there may be further wet or dry processing steps to be completed between the resist strip and the subsequent MOCVD barrier deposition of the barrier layer 16, though in this case none were used. As these processes are known to a person skilled in the art they are not detailed here.

MOCVD titanium nitride TiN (Si) was deposited in a stand alone system using TDEAT (Tetra Diethyl Amino Titanium) and ammonia precursors together with helium ballast. Immediately after deposition, the MOCVD film was hydrogen plasma treated and then silane soaked. There were no thermal or plasma treatments prior to deposition.

Figure 1:
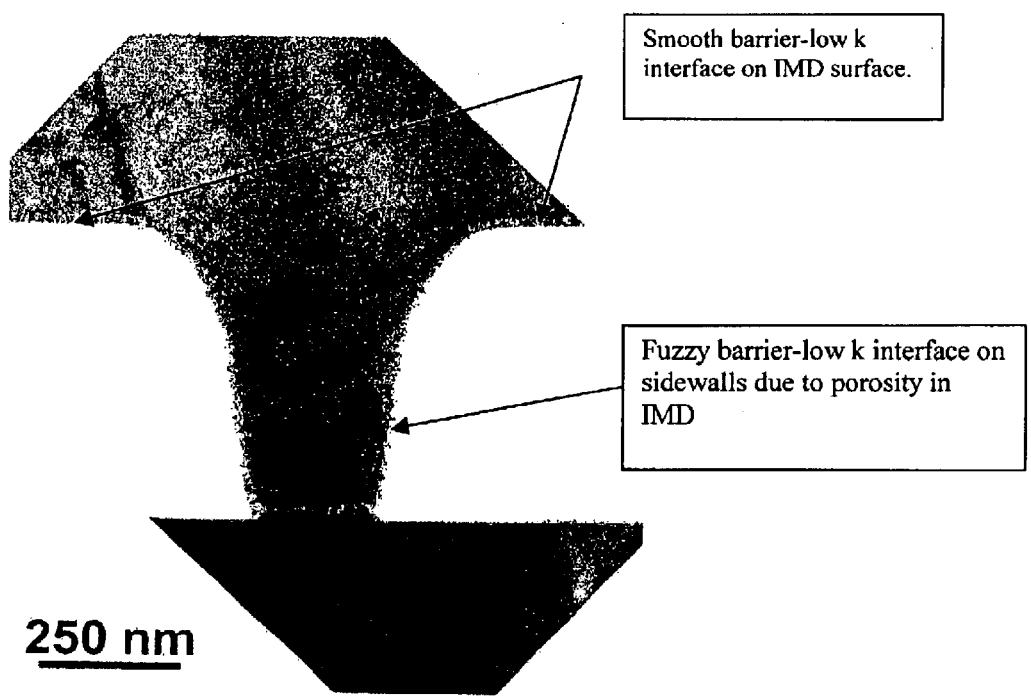
FIG. 1 is a TEM cross-section showing (AL) CVD TiN barrier interaction with porous low k IMD.
Figure 2:
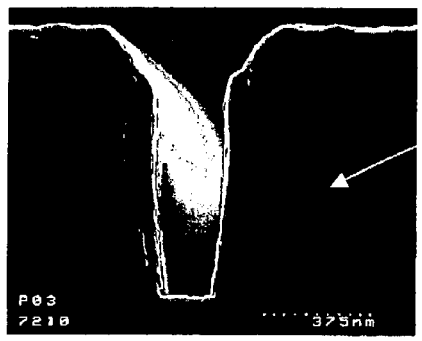
FIG. 2 is an SEM cross-section showing (MO) CVD TiN barrier interaction.
Figure 2:
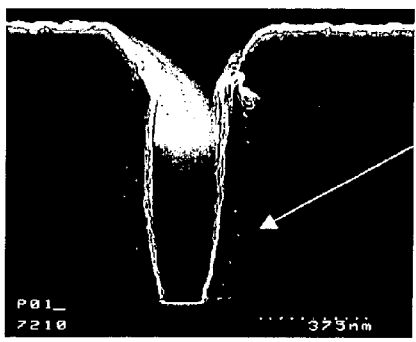
Figure 2:
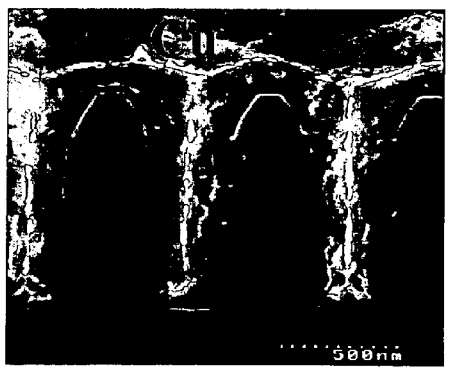
Figure 2:
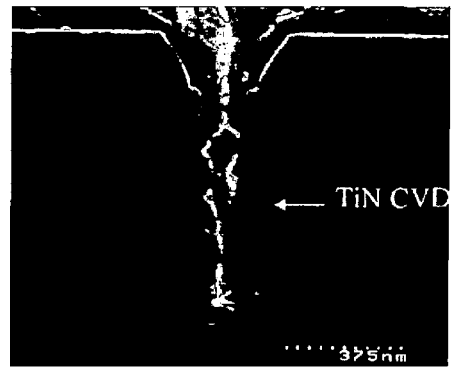
Figure 4:
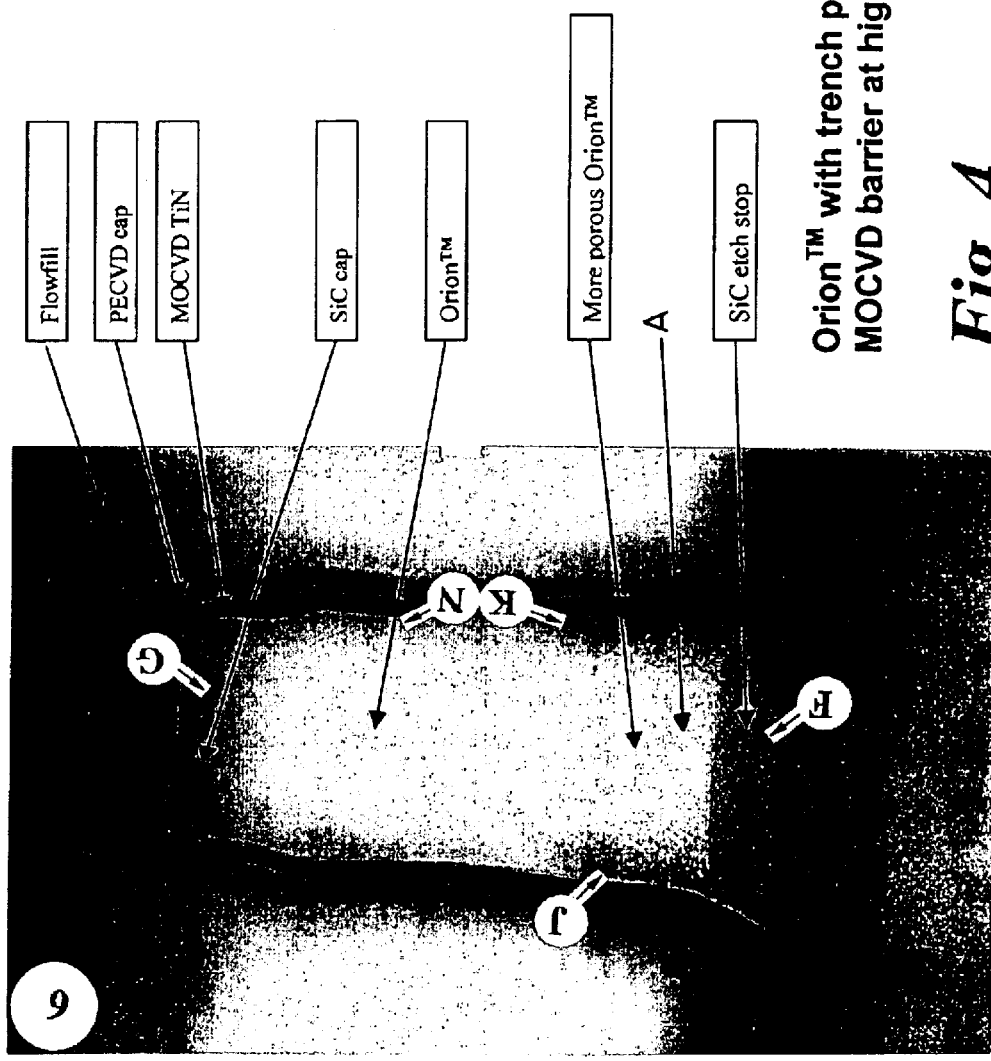
FIG. 4 is an enlarged view of part of FIG. 3.

It will be seen, immediately, from FIG. 3 and even more clearly from FIG. 4 that the interface between the barrier 16 and the trench side wall is smooth and continuous and this is in complete contrast to the prior art arrangements shown in FIGS. 1 and 2. Further the barrier layer itself is smooth and continuous. The micrograph further reveals that the trench side walls adjacent to the barrier layer are less porous (denser) than the regions further away from the side walls. The denser regions are darker in the bright field TEM imagining and are marked J and K in the micrograph.

As the deposited film was laterally homogeneous, then densification of the etched side walls has taken place during the trench formation (plasma etch and/or subsequent resist strip). It is believed that at least the majority of the densification has taken place during the resist strip largely because during the etching of the formations there are large amounts of polymer present on the side walls (to effect anoisotrophic etching) that is removed by the subsequent strip processes.

Figure 5A:
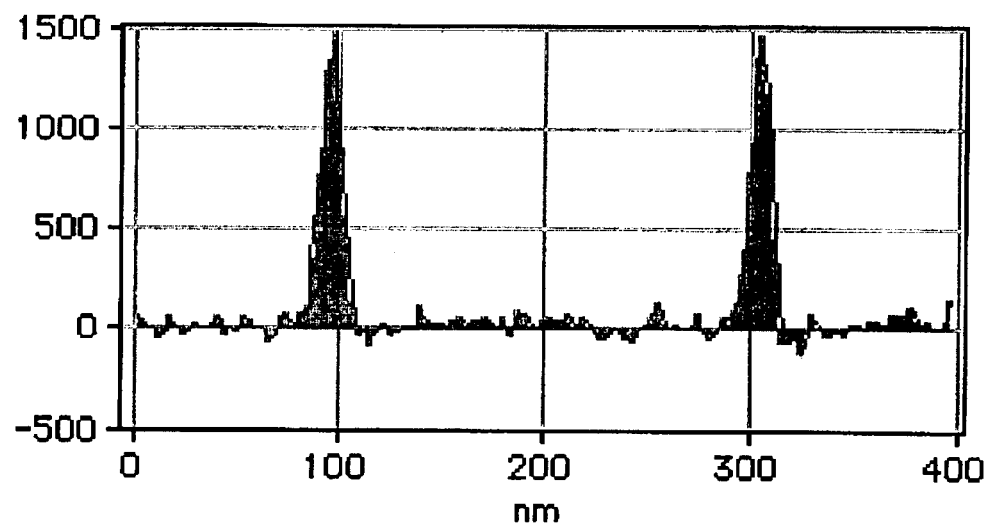
FIGS. 5a–d are electron energy loss spectroscopy (EELS) graphically represented results taken across a line A as indicated in FIG. 4.
Figure 5B:
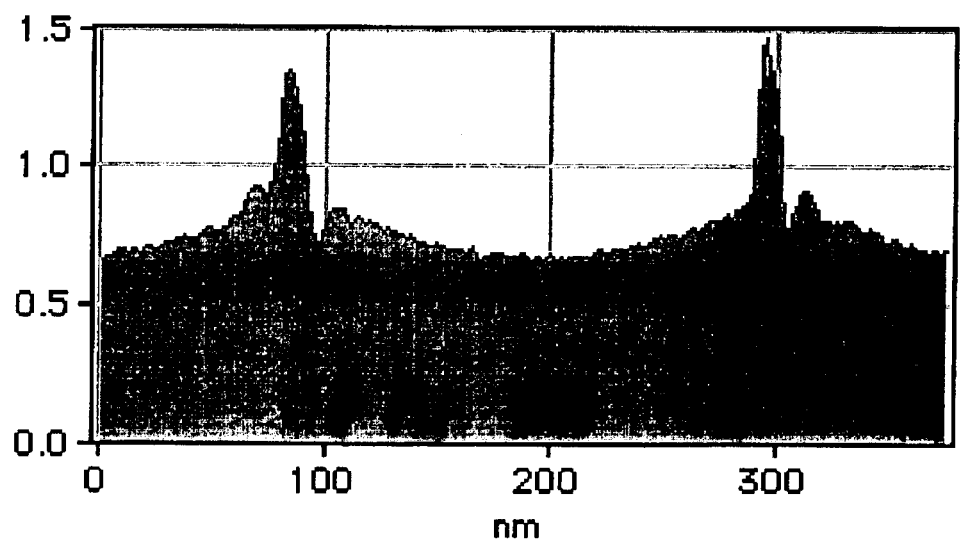
Figure 5C:
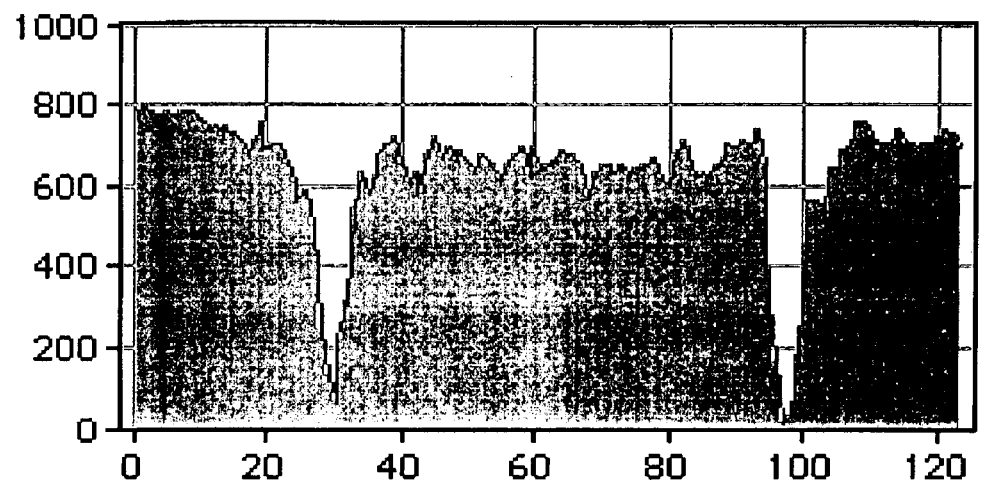
Figure 5D:
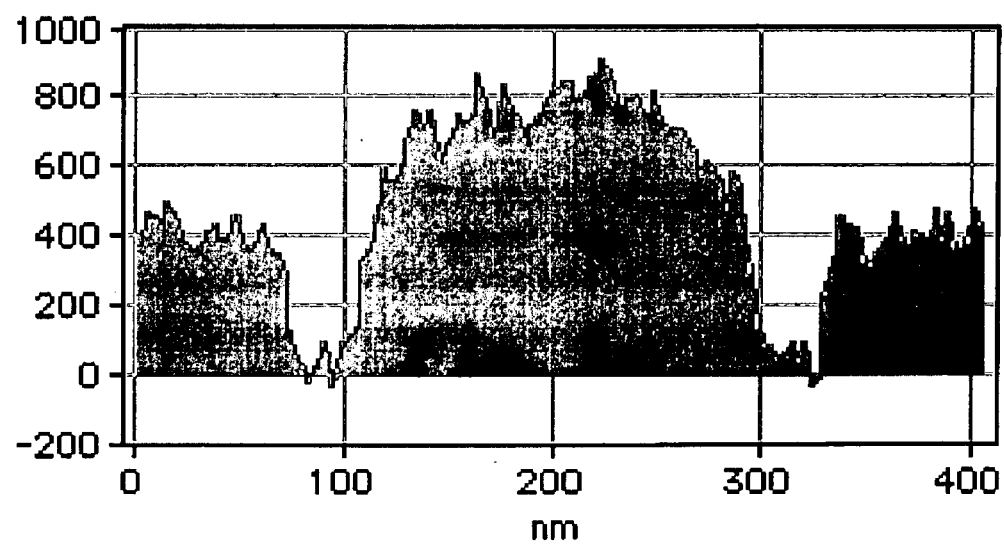

Further evidence for side wall densification comes from FIGS. 5a–c. The electron energy loss spectroscopy analysis can be used to provide information about the overall thickness and composition of the sample and also the distribution of individual elements. Spatial maps can be generated in a series of such one dimensional maps were taken in the axis identified by the line A of FIG. 4 and the results are shown in FIGS. 5a–b.

Comparisons of the maps support the existence of a densified trench side wall. The signal plotted in 5a varies with sample thickness and sample composition/density. The concave nature of the signal from the layer 13 between the twin peaks of the barrier layer 16 show that the dielectric 13 is denser or thicker near the side walls. It is not believed that the variation is due to thickness. FIG. 5b shows the titanium signal and confirms that the barrier layer 16 is tightly confined, there being no detectable titanium signal from within the film 13. FIG. 5c shows that the trench side walls are depleted of carbon whereas the oxygen profile in 5d is comparatively flat.

It is therefore concluded that the trench etch and/or resist strip process is densifying the trench side walls of the porous low-k layer, thereby providing a smooth surface to prevent penetration of barrier layer precursors or reactants. This enables the deposition of a continuous barrier thereby preventing copper penetration. Whilst the experiments have only so far been performed on the Applicants' material it is believed that the same results would be obtained with at least some other ultra low k porous dielectrics particularly those of the SiCOH family, being hydrogenated carbon containing silicon dioxides that are porous. The carbon and hydrogen is in such film typically as C—$H_3$ groups with C—Si bonds effectively tying in large amount of hydrogen and this hydrogen is considered the main cause of the low-k value for the matrix of the film together with the resultant porosity.

The precise mechanism for the densification is not yet known, but it is believed likely that the depletion of carbon from the densified layers enables the forming of Si—Si bonds between trivalent silicon atoms.

The reactive ion etch process of the BARC and porous low-k SICOH material with a photo resist mask on 200 mm wafers was:

| | |
|---|---|
| Process gasses | $CF_4$, and $CH_2F_2$ in the ratio 4.4:1 to 6.6:1 |
| Pressure | 1.5–2 millitorr |
| Plasma power | 1.25 KW to an inductive antenna |
| Wafer bias power | 400 watts |
| Platen temperature | −15° C |

The reactive ion photo resist strip process on 200 mm wafers, carried out in the same chamber was:

| | |
|---|---|
| Process gasses | $N_2$ and $H_2$ in the ratio 5:1 |
| Pressure | 5 millitorr |
| Plasma power | 2.5 KW to an inductive antenna |
| Wafer bias power | 200 watts |
| Platen temperature | 0° C. |

The etch process was with electrostatic wafer clamping and helium back side pressurisation and wafer temperature will therefore be close to the platen temperature. A low temperature is used to retain resist integrity.

For the resist strip process the wafer was unclamped to allow higher wafer temperatures, thereby improving residue removal efficiency and increasing strip rate. Peak wafer temperature was indicated as 121° C. (be means of industry standard thermal stickers) at 0° C. platen temperature and 104° C. at −15° C. platen temperature.

These experiments have used nitrogen and hydrogen, however if nitrogen is not chemically active in the densification process then alternatives may be substituted such as helium, neon, argon, xenon and krypton or any other suitable sputter etch gas. Alternatively they may be added to the nitrogen and/or hydrogen gas mix.

Further work has been performed to illustrate the effectiveness of the invention. At FIG. 6(a) is shown a bright field TEM image of a completed structure consisting of dielectric of the invention with an MOCVD deposited titanium nitride barrier and completed copper trench fill consisting of a sputtered copper seed layer, electroplated copper and chemical mechanical polishing step. As can be seen there has been no diffusion of metal from either the barrier or copper into the dielectric.

Further FIG. 6(a) shows an amorphous layer of 5 to 8 nanometers thickness that is modified by the plasma treatment and is of higher density compared to the bulk of the porous dielectric.

Figure 6B:
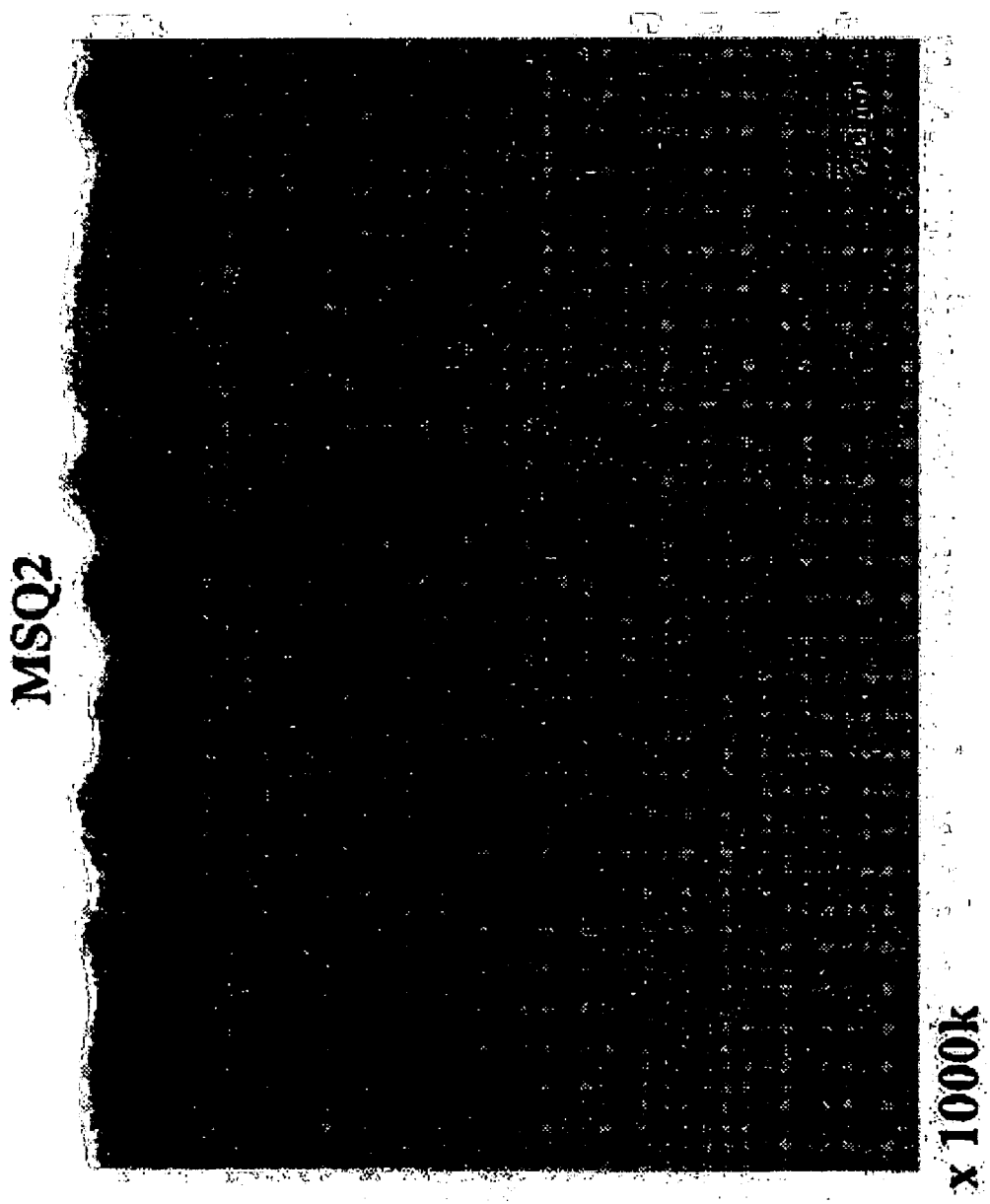
FIG. 6b and 6c are bright field TEMS illustrating precursor diffusion of the prior art.
Figure 6C:
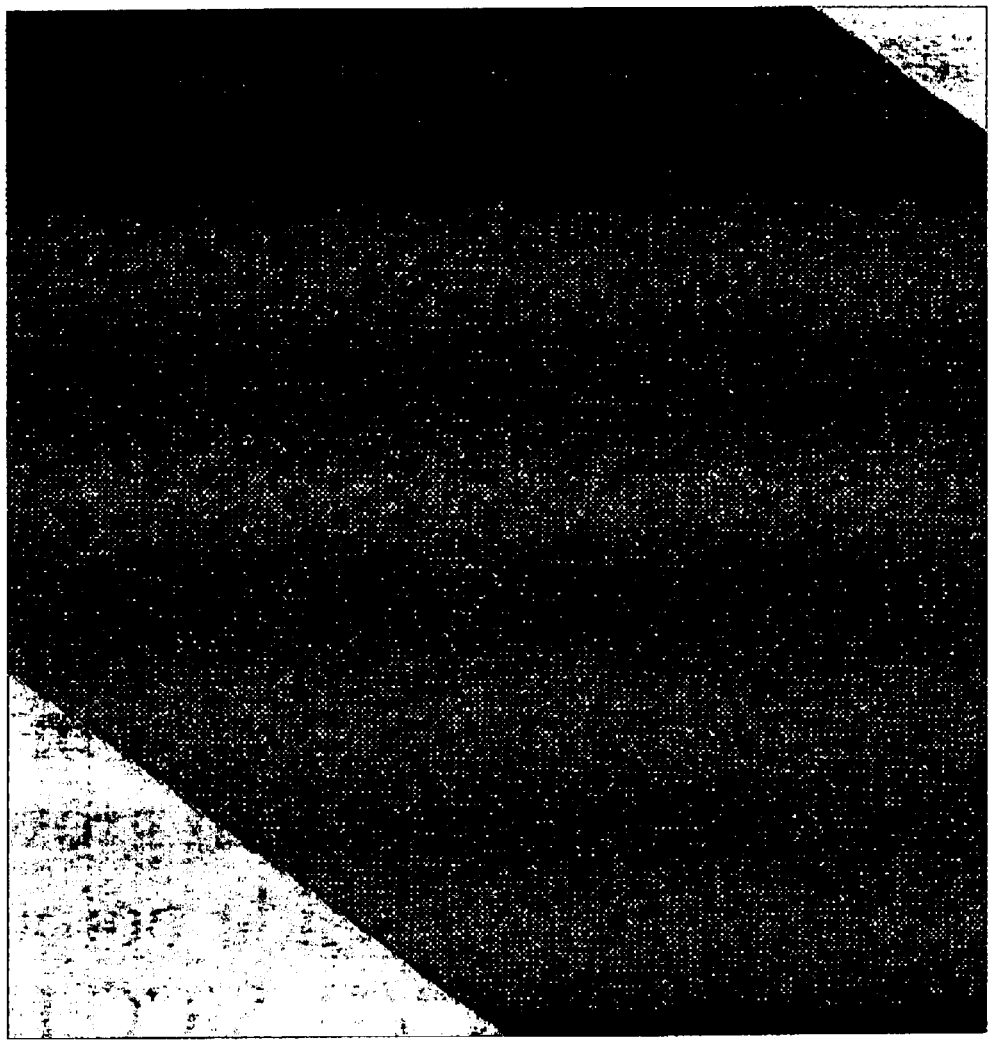

In contrast at FIGS. 6(b) and 6(c) are shown precursor diffusion. The image at 6(b) is from W. Besling, Proc. IITC 2002 Burlingame (Calif.) USA, 2002 pp 288–291. The image at 6(c) is from S. Kawamura et. al. Proc IITC 2001 San Francisco, USA, pp 195–197. As can be seen bright field TEM imagery is a well known and acceptable indication of metal diffusion into a dielectric material.

Figure 7:
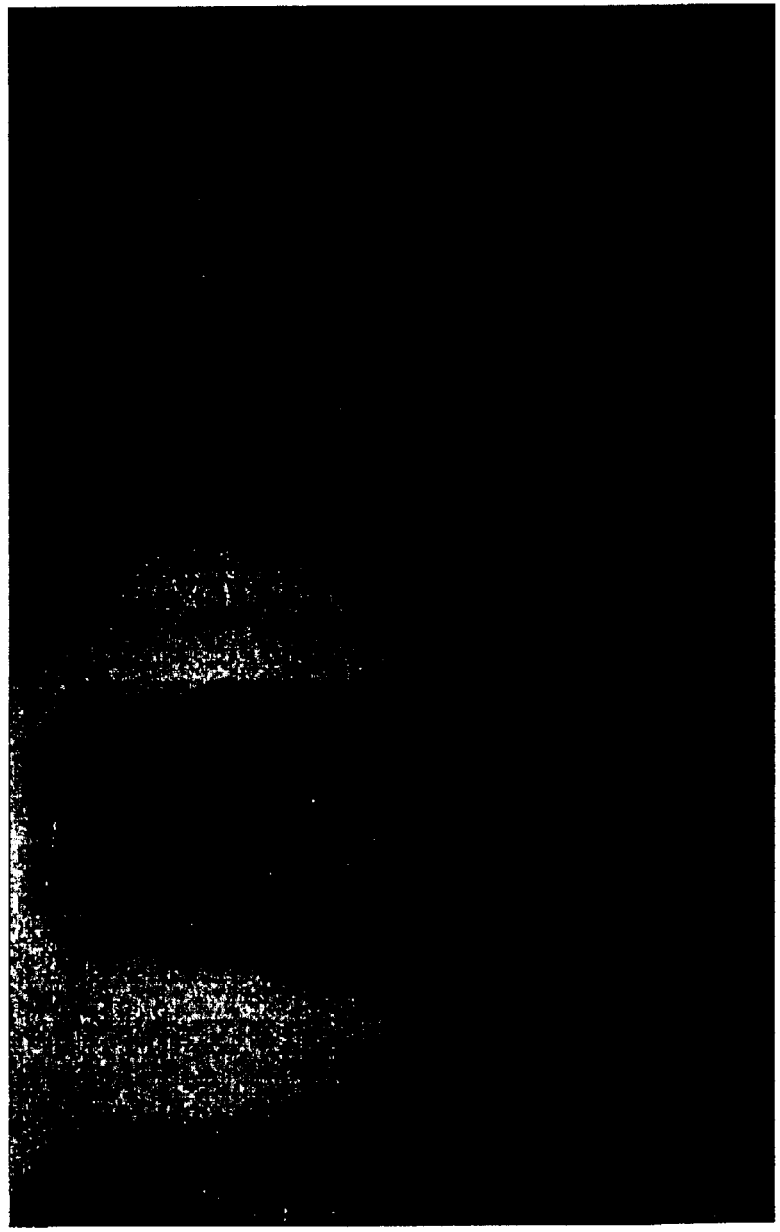
FIG. 7 shows a bright field TEM of a 0.18 micron structure illustrating features of the invention (equivalent to FIG. 3, but smaller structure).

FIG. 7 is TEM image of a 0.18 micron structure formed as previously described in relation to FIG. 3. No metal diffusion for the barrier can be seen and this is further evidenced at FIGS. 8(a) and 8(b) that are EELS line scans for titanium of the structure shown at FIG. 7.

Figure 8:
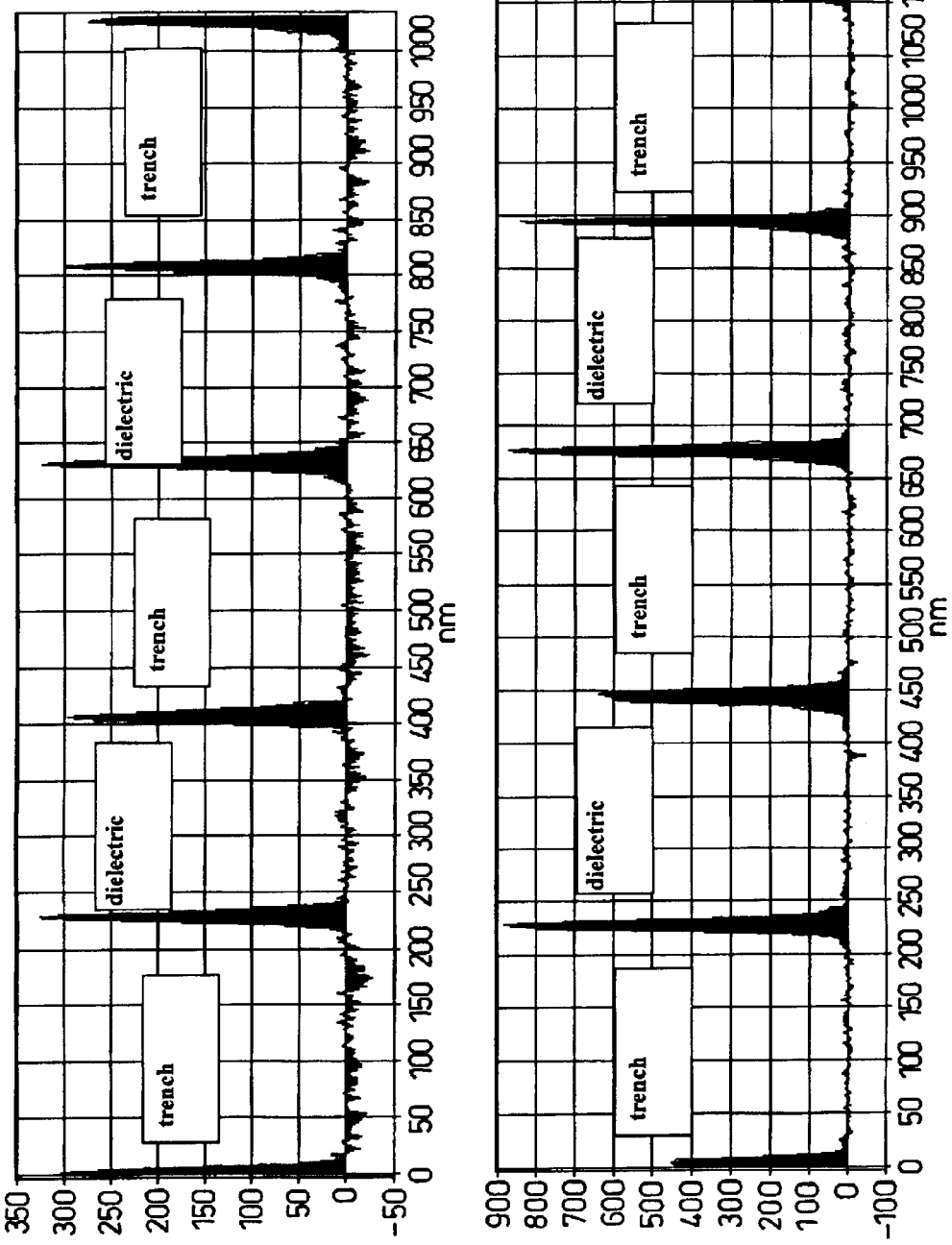
FIG. 8 is an EELS scan for titanium of the structure of FIG. 7 for both a) nitrogen and oxygen resist strip/treatment and b) nitrogen and hydrogen resist strip/treatment.

FIG. 8(a) illustrates the EELS scan for a nitrogen and hydrogen gas mix. At FIG. 8(b) a gas mix of 200 sccm of nitrogen and 10 sccm of oxygen was used (a ratio of 40:1 is the best that has been established at this time). Oxygen is well known to remove carbon and this experiment illustrates that nitrogen can reduce the carbon removal effect of the oxygen and allow porous dielectrics to withstand a high degree the absorption of a gaseous metal precursor (though not as good as nitrogen+hydrogen). This process is in contrast to that described in EP-A-1195801 in which a nitrogen/oxygen plasma is used to form a sealing layer.

Figure 9:
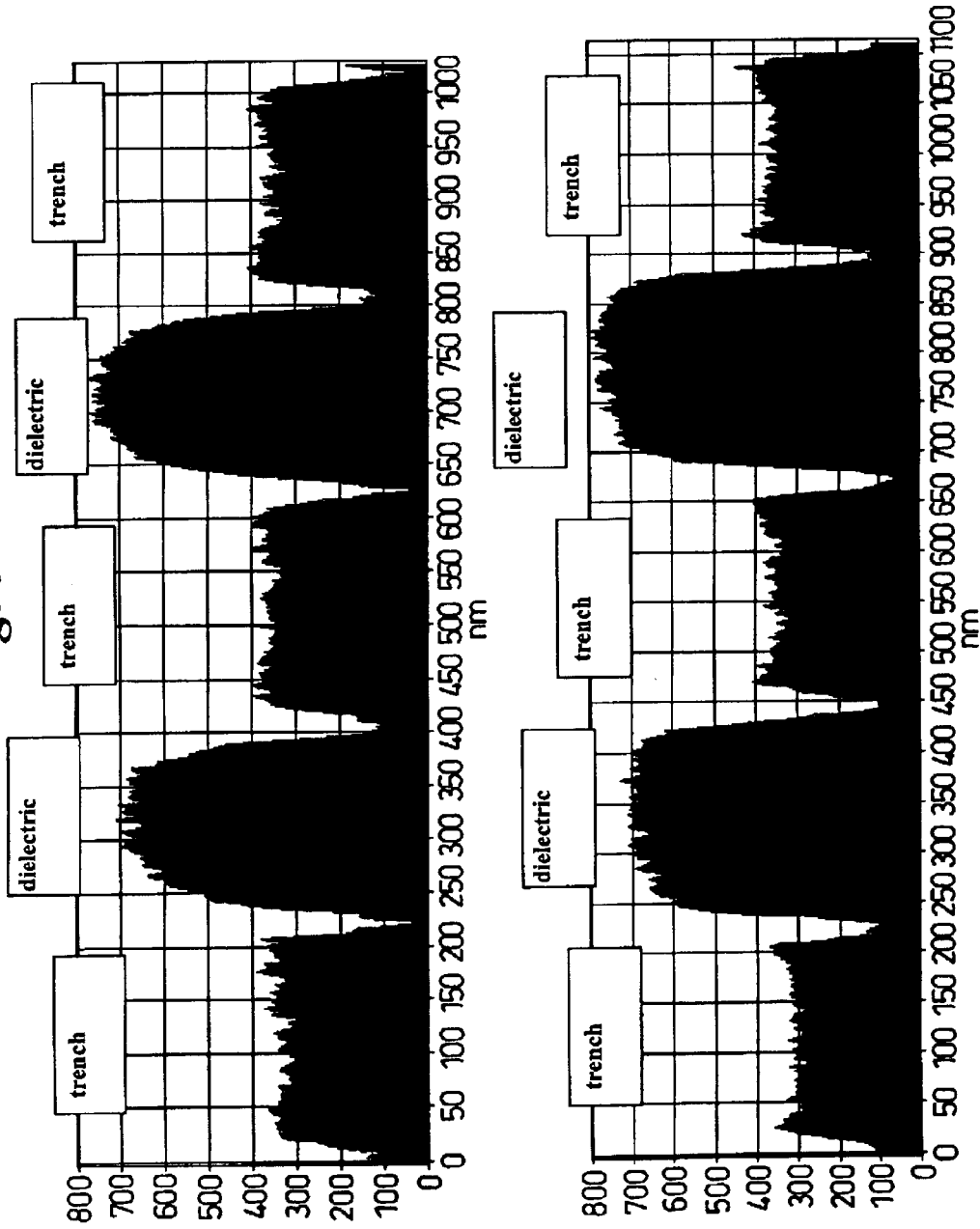
FIG. 9 is an EELS scan for carbon of the structure of FIG. 7 for both a) nitrogen and oxygen resist strip/treatment and b) nitrogen and hydrogen resist strip/treatment.

FIGS. 9(a) and 9(b) show EELS line scans through the structure of FIG. 7 for carbon. In FIG. 9(a), the EELS scan for nitrogen and oxygen shows there is greater carbon loss at the dielectric side walls than is the case for nitrogen and hydrogen as illustrated at FIG. 9(b).

Figures 10A, 10B, 10C, 10D:
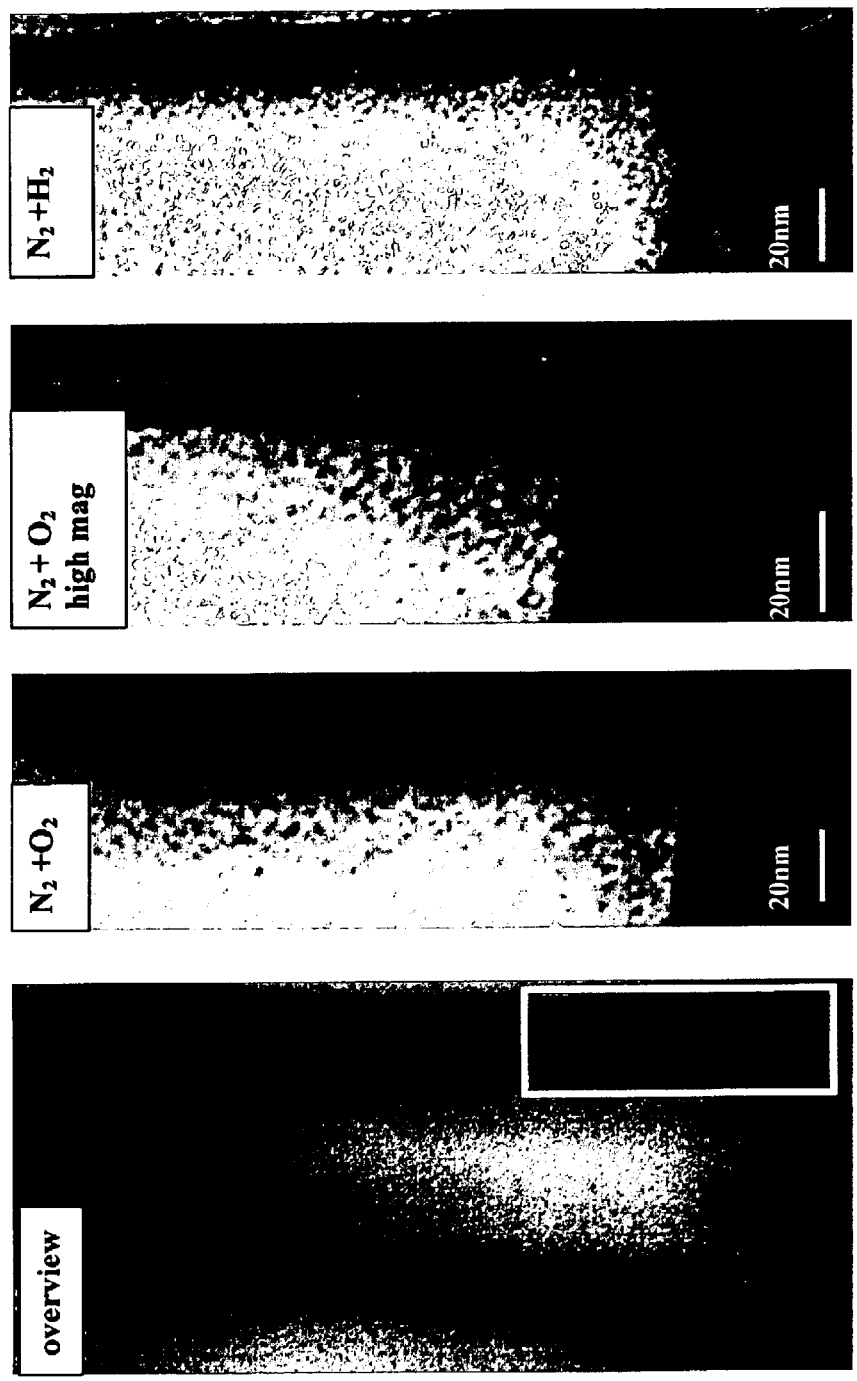
FIG. 10 shows bright field TEM of a cross section of a dielectric material formed with trenches to illustrate features of the invention where a) is an overview and b), c) and d) are at higher magnification.

FIG. 10 is a further illustration of an embodiment of the invention in bright field TEM images. FIG. 10(a) is an overview of a structure formed as described above at FIG. 3. FIG. 10(d) is the result of the nitrogen and hydrogen process described in detail earlier and FIGS. 10(b) and 10(c) are images illustrating a nitrogen and oxygen gas mix treatment.

FIGS. 11 to 14 show results from electrical test structures formed with dielectric which are embodiments of the invention. The test structures were single damascene of line width/line spacing of 0.18 and 0.25 micron trenches/spacers. The interdigital comb was 100 microns by 1600 microns in size with a 44 cm perimeter. Inter-line leakage was measured at 0.5 MV/cm and interline capacitance was measured at 1 MHz.

The plasma treatment/resist strip processes were as follows:

| | |
|---|---|
| Nitrogen + Hydrogen | (5:1 ratio) |
| Nitrogen | 200 sccm (std. cubic centiliters per minute) |
| Hydrogen | 40 sccm |
| Pressure | 7 millitorr |
| Platen temperature | −15° C. Electrostatic chuck with 2 Torr helium back pressure |
| MORI ™ plasma source | (inductively coupled) |
| Plasma power | 2.5 Kw to inductive antenna 13.56 MHz |
| Magnet power | 40/60 Amps inner/outer coils |
| Platen power (wafer bias) | 200 W 13.56 MHz |
| Nitrogen + Oxygen | (20:1 ratio) |
| Nitrogen | 200 sccm |
| Oxygen | 10 sccm |
| Pressure | 7 millitorr |

-continued

| | |
|---|---|
| Platen temperature | −15° C. Electrostatic chuck with 2 Torr helium back pressure |
| MORI ™ plasma source | (inductively coupled) |
| Plasma power | 2.5 Kw to inductive antenna 13.56 MHz |
| Magnet power | 60/60 Amps inner/outer coils |
| Platen power (wafer bias) | 30 W 13.56 MHz |

This was the best nitrogen+oxygen process for densification and is in contrast to the sealing process of EP-A-1195801.

Note that in these subsequent experiments, the wafers were clamped electrostatically thereby lowering their temperature to close to the platen temperature. It was found that the processes were still effective at these lower wafer temperatures.

Figure 11:
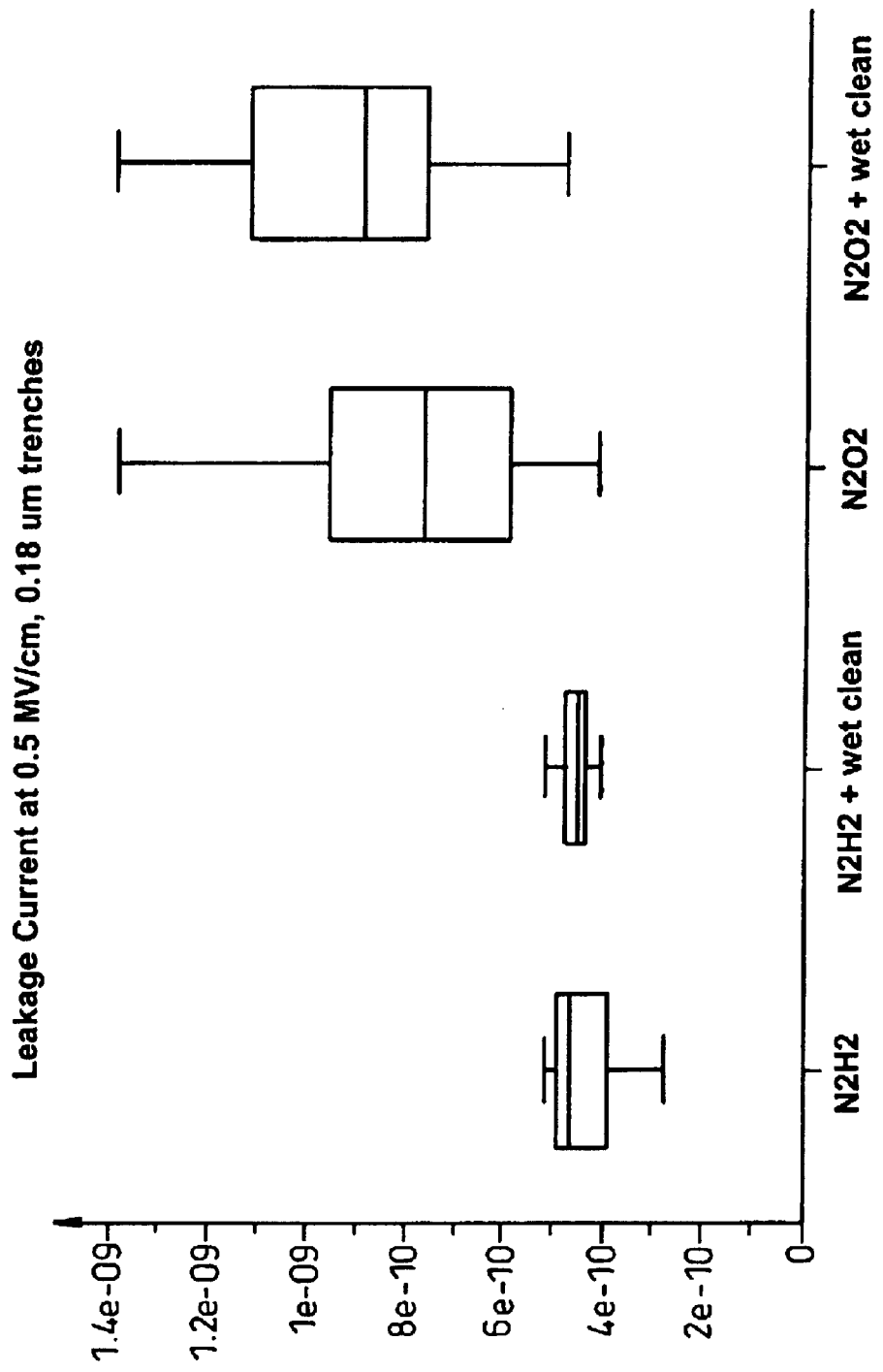
FIG. 11 shows leakage current through structures made with the invention in 0.18 micron trenches.

FIG. 11 shows the results for leakage current (less is better) on 0.18 micron trenches for both nitrogen+hydrogen and nitrogen+oxygen gas mixtures. As can be seen the oxygen degrades the performance compared to the hydrogen. This is to be expected given the EELS result of FIGS. 9(a) and 9(b) showing increased carbon loss for the nitrogen+oxygen process. Further, a wet clean does not degrade the nitrogen+hydrogen treated dielectric, but does degrade slightly the nitrogen+oxygen treated dielectric, further indicating a degree of porosity. Such wet cleans are widely known and used in the industry to remove any residues after a dry resist strip process.

Figure 12:
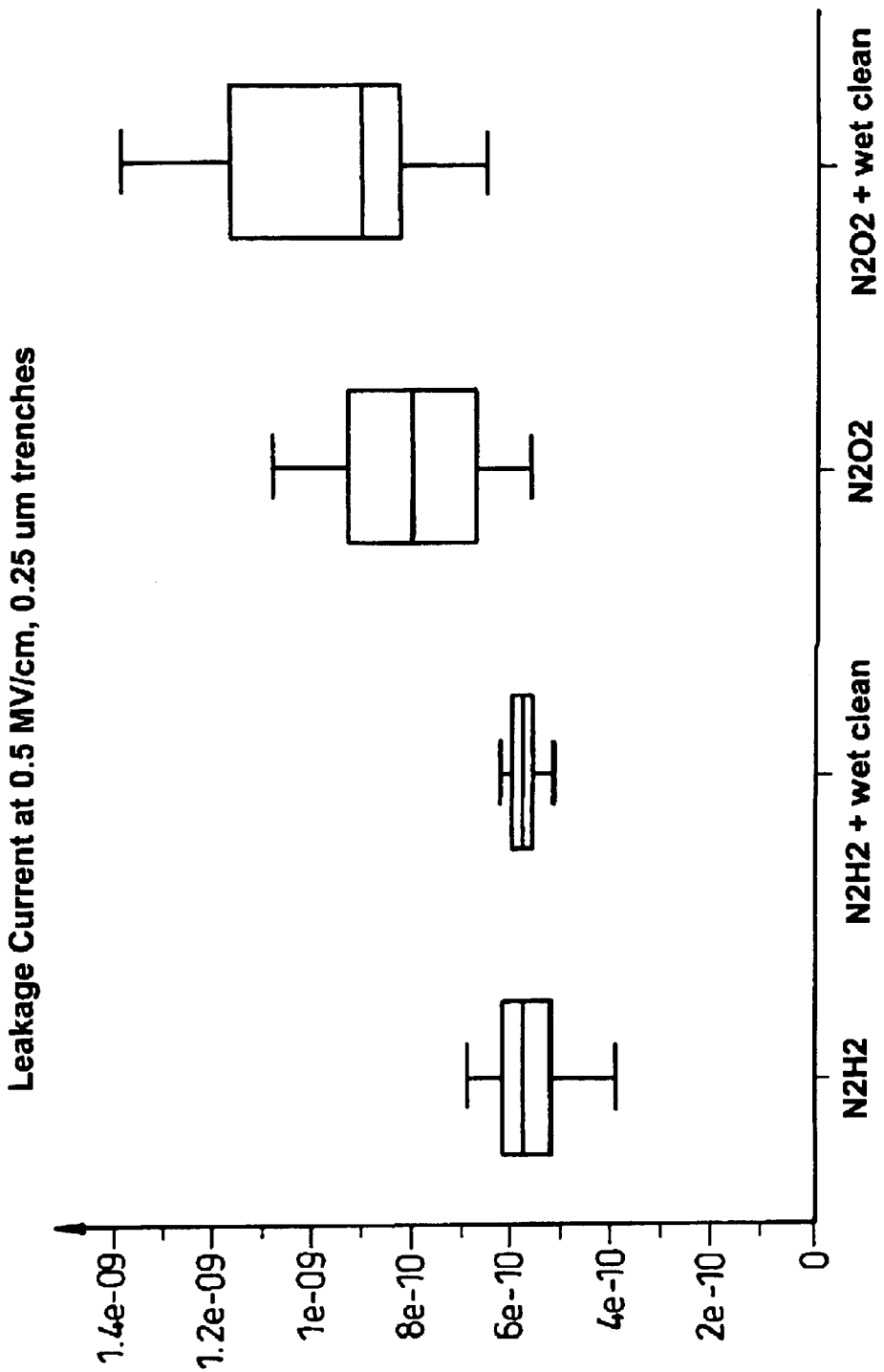
FIG. 12 shows leakage current through structures made with the invention in 0.25 micron trenches.

FIG. 12 is a further illustration of the comparative effects of nitrogen and hydrogen or oxygen as for FIG. 11 but on 0.25 micron structures. The results and conclusions are the same as for FIG. 11.

Figure 13:
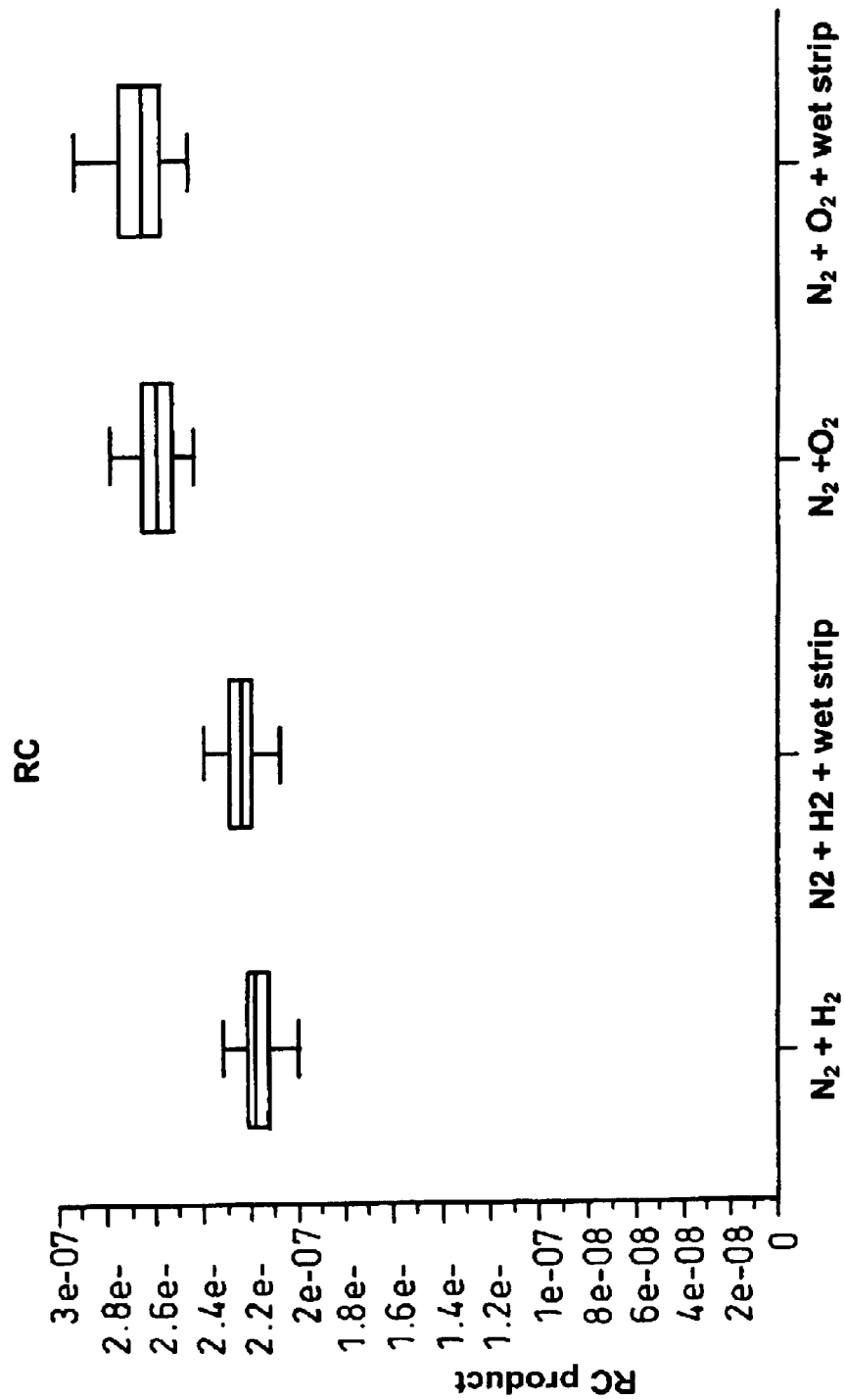
FIG. 13 shows RC product through structures made with the invention.

FIG. 13 shoes the RC product (less is better) from the test structures. As can be seen an industry standard wet clean does degrade the RC product slightly for both nitrogen+hydrogen and nitrogen+oxygen processes, with again better results for the nitrogen+hydrogen processes.

Figure 14:
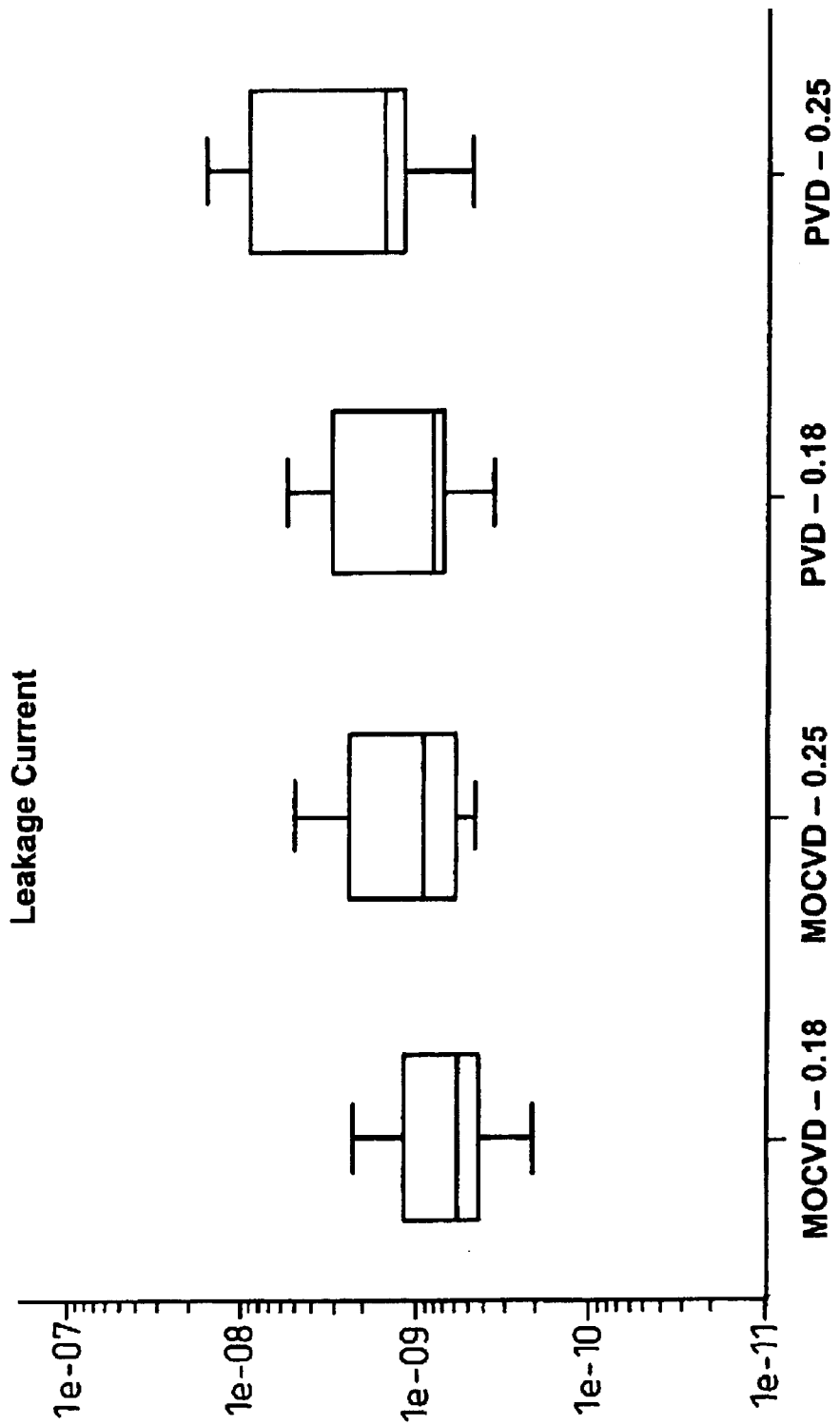
FIG. 14 shows comparisons between MOCVD and sputtered (PVD) barriers upon dielectrics of the invention.

FIG. 14 shows comparative results from 0.18 and 0.25 micron test electrical test structures with the barrier deposited by MOCVD and PVD (sputtering) means. The comparison shows that the leakage currents are low, and similar.

What is claimed is:

1. A porous dielectric film having a dielectric constant (k) of less than about 2.5 and a carbon content of not less than 10% including a via or other formation etched therein wherein the exposed surface or surfaces of the film within the via or formation is substantially non-porous and wherein regions of the film adjacent to side walls of the via or formation are less porous than regions further away from the side walls.

2. A film as claimed in claim 1 wherein the exposed surface or surfaces is formed by a layer which is carbon depleted with respect to the bulk of the film.

3. A film as claimed in claim 1 wherein the matrix of the film is formed of a SiCOH material.

4. A film as claimed in claim 1 wherein the exposed surface or surfaces is covered by a barrier layer.

5. A film as claimed in claim 4 wherein the barrier layer does not penetrate the exposed surface or surfaces.

6. A film as claimed in claim 1 wherein the via or formation is filled with a metal.

7. A film as claimed in claim 1 wherein the via or formation is filled with copper.

8. A film as claimed in claim 1 wherein the film forms a damascene structure.

9. A porous dielectric film having a dielectric constant (k) of less than about 2.5 and a carbon content of not less than 10% including a via or other formation etched therein characterised in that the exposed surface or surfaces of the film within the via or formation is substantially non-porous, wherein the exposed surface or surfaces is formed by a layer which is oxygen depleted with respect to the bulk of the film.

10. A film as claimed in claim 9 wherein the Si—Si bonds are formed between trivalent Si molecules.

11. A porous dielectric film having a dielectric constant (k) of less than about 2.5 and a carbon content of not less than 10% including a via or other formation etched therein characterised in that the exposed surface or surfaces of the film within the via or formation is substantially non-porous, wherein the exposed surface or surfaces is formed of a layer constituted substantially by Si—Si bonds.

12. A porous dielectric film having a dielectric constant (k) of less than about 2.5 and a carbon content of not less than 10% including a via or other formation etched therein characterised in that the exposed surface or surfaces of the film within the via or formation is substantially non-porous, wherein the surface forming layer is formed by a nitrogen and/or hydrogen plasma treatment of the etched surface or surfaces.

13. A porous dielectric film having a dielectric constant (k) of less than about 2.5 and a carbon content of not less than 10% including a via or other formation etched therein characterised in that the exposed surface or surfaces of the film within the via or formation is substantially non-porous, wherein the exposed surface or surfaces is covered by a barrier layer, and wherein the barrier layer is deposited by chemical vapour deposition.

14. A method of forming an interconnect layer in a semiconductor device including:

a. depositing a low-k porous dielectric film on a substrate;
 b. depositing resist;
 c. patterning the resist to define etch apertures;
 d. etching vias or formation in the dielectric layer through the apertures; and
 e. stripping the resist characterised in that the resist is stripped with a nitrogen or a noble gas, or combination thereof, and hydrogen plasma or nitrogen or a noble gas, or a combination thereof, and oxygen plasma and the exposed surfaces of the vias or formations are simultaneously exposed to the plasma ensuring densification of the surface layers which define the exposed surfaces, wherein the ratio of $N_2:O_2$ is at least about 15:1.

15. A method as claimed in claim 14 wherein a barrier layer is deposited on the densified exposed surfaces.

16. A method as claimed in claim 15 wherein the barrier layer is deposited by chemical vapour deposition.

17. A method as claimed in claim 14 wherein the ratio of $N_2:H_2$ is about 3–7:1.

18. A method as claimed in claim 14 wherein the $N_2:N_2$ ratio is about 20:1.

19. A method as claimed in claim 14 wherein the substrate is RF biased during the stripping of the photo resist.

* * * * *